United States Patent
Yeh et al.

[11] Patent Number: 6,039,857
[45] Date of Patent: Mar. 21, 2000

[54] METHOD FOR FORMING A POLYOXIDE FILM ON DOPED POLYSILICON BY ANODIZATION

[76] Inventors: Ching-Fa Yeh; Jeng-Shu Liu, both of Department of Electronics Engineering, National Chiao-Tung University, Hsinchu, Taiwan

[21] Appl. No.: 09/188,062

[22] Filed: Nov. 9, 1998

[51] Int. Cl.⁷ ................................................. C25D 5/18
[52] U.S. Cl. .................... 205/106; 205/108; 205/124; 205/157; 205/220; 205/229
[58] Field of Search .................................. 205/124, 157, 205/106, 108, 220, 229

[56] References Cited

U.S. PATENT DOCUMENTS

| | | | |
|---|---|---|---|
| 3,377,258 | 4/1968 | Schmidt et al. | 204/15 |
| 3,547,786 | 12/1970 | Rigo | 204/38 |
| 3,764,491 | 10/1973 | Schwartz | 204/56 |
| 3,890,169 | 6/1975 | Schwartz et al. | 148/187 |
| 3,942,241 | 3/1976 | Harigaya et al. | 29/571 |
| 4,289,602 | 9/1981 | Sansregret | 204/32 S |
| 4,488,349 | 12/1984 | Murakami et al. | 29/575 |
| 4,759,830 | 7/1988 | Gruniger et al. | 204/39 |
| 5,616,233 | 4/1997 | Jenn-Gwo et al. | 205/157 |
| 5,746,454 | 5/1998 | Hwu et al. | 438/585 |

*Primary Examiner*—Kathryn Gorgos
*Assistant Examiner*—Christopher M Keehan
*Attorney, Agent, or Firm*—Bacon & Thomas, PLLC

[57] ABSTRACT

The present invention relates to a method for forming a polyoxide film on a doped polysilicon layer, which is suitable for use as an inter-polysilicon polyoxide film between a doped polysilicon floating gate and a doped polysilicon control gate. The method includes conducting an electrolytic reaction at a room, temperature such that a polyoxide layer is formed on a doped polysilicon layer acting as an anode. The polyoxide layer is preferably further subjected with a rapid thermal processing to improve its electrical characteristics.

14 Claims, 5 Drawing Sheets

METHOD FOR FORMING A POLYOXIDE FILM ON DOPED POLYSILICON BY ANODIZATION

FIELD OF THE INVENTION

The present invention relates generally to a method for making a polyoxide layer on a doped polysilicon film, and more particularly to a method for forming an inter-polysilicon polyoxide film by anodic oxidation in the fabrication of a nonvolatile memory device.

BACKGROUND OF THE INVENTION

In order to improve the data retention characteristics for nonvolatile memory device, a high-quality inter-polysilicon polyoxide film is an indispensable dielectric material in terms of low leakage current and high electric breakdown field. So far polyoxide layers formed on polysilicon by high temperature oxidation with furnace or rapid thermal oxidation (RTO) still suffer defects of high leakage current and low electric breakdown field. The inventors of the present invention believe that these defects are brought about by non-uniform thickness of the polyoxide layer and the asperity at the polysilicon/polyoxide interface, which lead to the seriously enhanced localized electric field. The non-uniform thickness and asperity at the polysilicon/polyoxide interface problems are caused by different growing rates between the grain boundary and the grain bulk of the polysilicon layer in the high temperature oxidation process.

U.S. Pat. Nos. 5,616,233 and 5,736,454 disclose methods for forming a silicon dioxide layer on a single-crystal silicon substrate comprising conducting an electrolytic reaction at a room temperature such that a silicon dioxide layer is formed on a single-crystal silicon substrate acting as an anode. It was noted that the anodic oxide has the merit of less pinholes due to the self-readjustment nature of current conduction through the weak path in oxide during anodization. Therefore, it is believed that the anodic oxides should exhibit better oxide thickness uniformity and improved breakdown characteristics than the conventional thermal oxides as a gate oxide.

SUMMARY OF THE INVENTION

In this invention, anodic oxidation carried out at room temperature, and preferably followed by an annealing treatment, is proposed to prepare a thin polyoxide film on a doped polysilicon layer of a semiconductor device, such as nonvolatile memory device, dynamic random access memory (DRAM) and thin film transistor liquid crystal display (TFT-LCD). In the fabrications of the nonvolatile memory device and DRAM, the polyoxide film prepared by the method of the present invention is an inter-polysilicon polyoxide acting as a dielectric material, and in the TFT-LCD case the polyoxide film formed is a gate oxide.

It is supposed that this method can provide the advantages of uniformity in thickness of polyoxide and planarization at the polysilicon/polyoxide interface.

The present invention also disclosed a method to improve the data retention characteristics for nonvolatile memory device, which comprises forming a polyoxide film between the doped polysilicon floating gate and the doped polysilicon control gate by anodic oxidation carried out at room temperature, and preferably followed by an annealing treatment or a plasma passivation.

DETAILED DESCRIPTION OF THE INVENTION

The present invention discloses a method for forming a polyoxide layer on a doped polysilicon layer. Said method comprises conducting an electrolytic reaction at a room temperature such that the polyoxide layer is formed on the doped polysilicon layer acting as an anode. Any suitable electrolytic reaction systems and operational conditions known in the art can be used to conduct the electrolytic reaction of the present invention.

Figure 2:
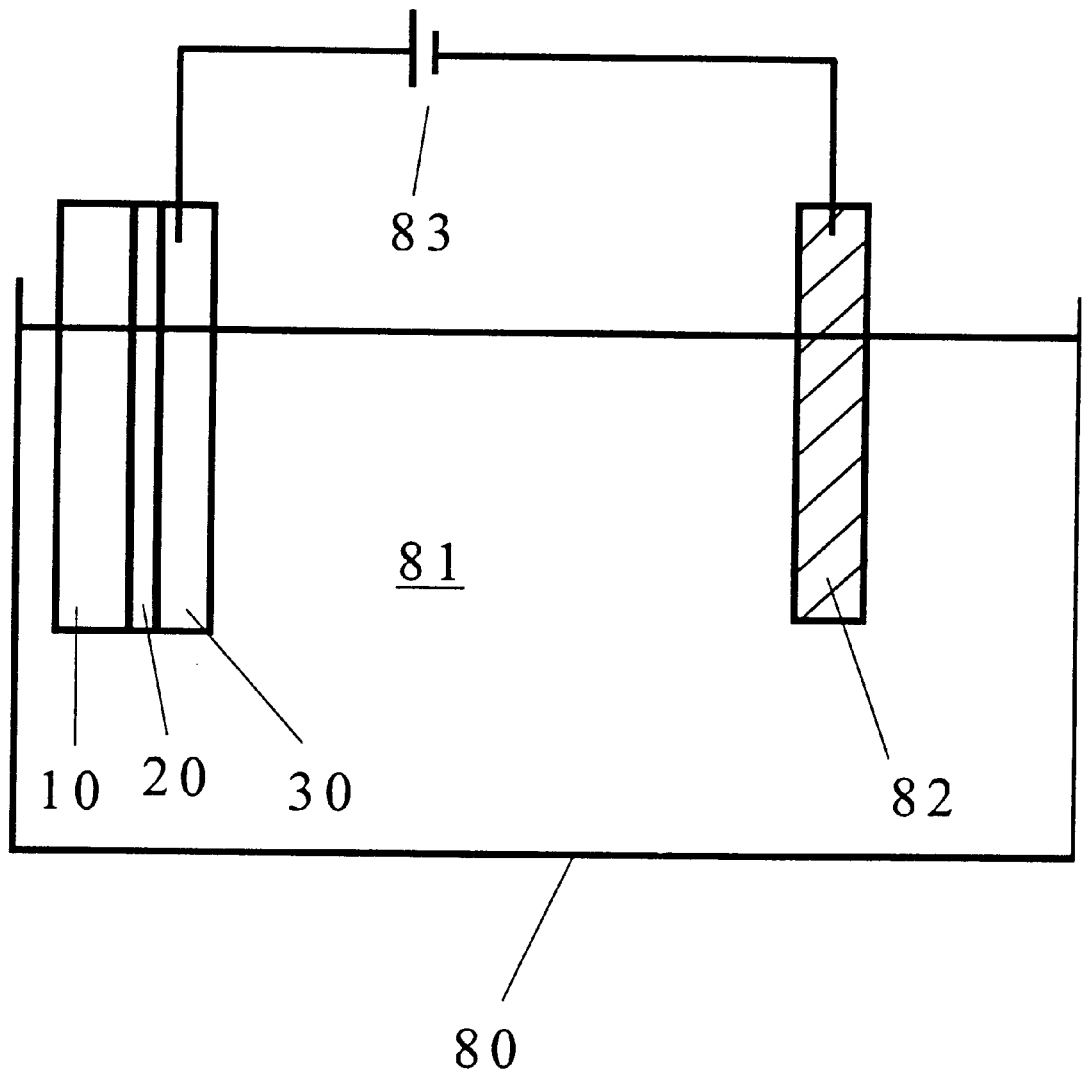
FIG. 2 is a schematic view of an electrolytic reaction system suitable for use in the present invention.

An electrolytic reaction system suitable for use in the method of the present invention, as shown in FIG. 2, comprises a container 80, an electrolyte solution 81 in the container 80, a Pt cathode 82 partially immersed in the electrolyte solution 81, and a Si-substrate/silicon dioxide/doped polysilicon (10/20/30) as an anode partially immersed in the electrolyte solution 81. When a negative (−) terminal and a positive (+) terminal of a DC-power supply 83 are connected to the Pt cathode 82 and the doped polysilicon 30 respectively, a polyoxide layer will be formed on the doped polysilicon 30 resulting from the reaction of silicon and oxygen ions generated in the electrolyte solution while hydrogen gas liberating at the cathode.

The electrolytic reaction of the method of the present invention can be conducted at any suitable temperatures, preferably at 0–60° C., and most preferably at room temperature. Pressure is not important to the electrolytic reaction, and preferably the electrolytic reaction of the method of the present invention is carried under atmospheric pressure.

The principle of selecting a suitable electrolyte solution 81 is the electrolyte must have no substantially adverse effects on the doped polysilicon layer 30 and the polyoxide layer to be formed thereon. The electrolyte solution 81 may be pure water or an aqueous solution containing a small amount of an electrolyte, for examples aqueous solutions containing 0.0001–5 wt % of citric acid or ammonia borate.

The electrolytic reaction can be carried out with a constant or variable current ranging from 0.001–2 A, or with a constant or variable electrolyzing voltage ranging from 1–150 V.

Preferably, the method of the present invention further comprises an annealing treatment in which the polyoxide layer formed is heated in an atmosphere of $N_2$, $N_2O$, $O_2$ or a mixture of each other, and at a temperature of 400–1100° C. for a period of time 5–300 seconds by RTP and 2–60 minutes by furnace, after removing said Si-substrate/silicon dioxide/polysilicon (10/20/30) from said electrolyte solution 81.

Selectively, the method of the present invention further comprises subjecting the polyoxide layer formed to a conventional plasma passivation treatment.

The invention will be further illustrated by the following example. The following example is only meant to illustrate the invention, but not to limit it.

EXAMPLE

Fabrication of $n^+$-polysilicon/polyoxide/$n^+$-polysilicon capacitor and characteristics thereof In this example a $n^+$-polysilicon/polyoxide/$n^+$-polysilicon capacitor was fabricated as shown in FIGS. 1(a) to 1(g).

Figure 1A:
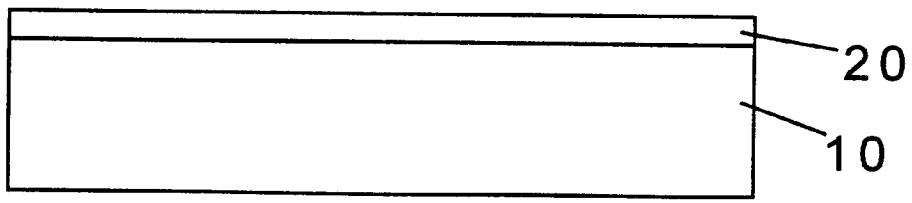
FIGS. 1(a) to 1(g) are cross-sectional views showing a fabrication scheme of an $n^+$-polysilicon/polyoxide/$n^+$-polysilicon capacitor according to the present invention.
Figure 1B:
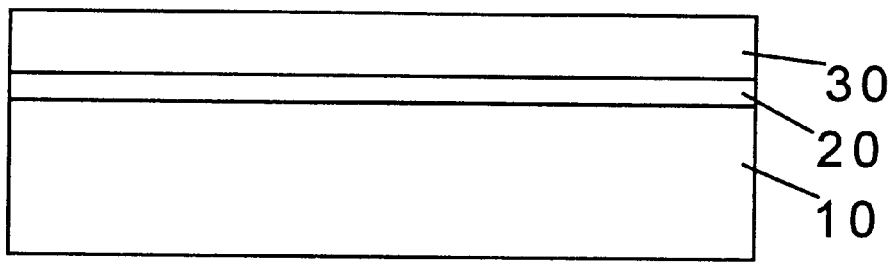
Figure 1C:
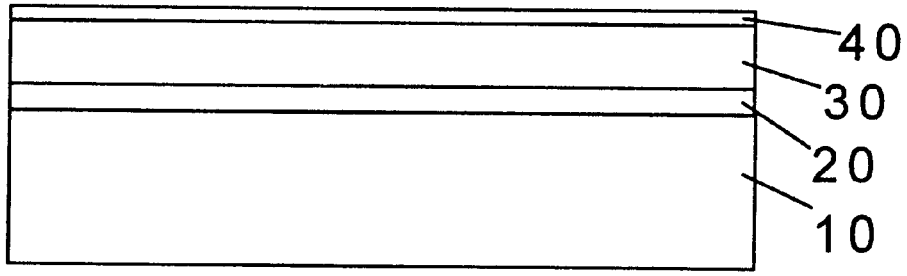
Figure 1D:
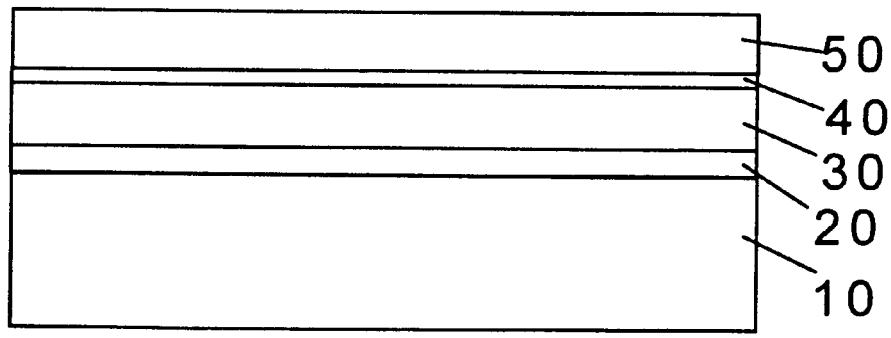
Figure 1E:
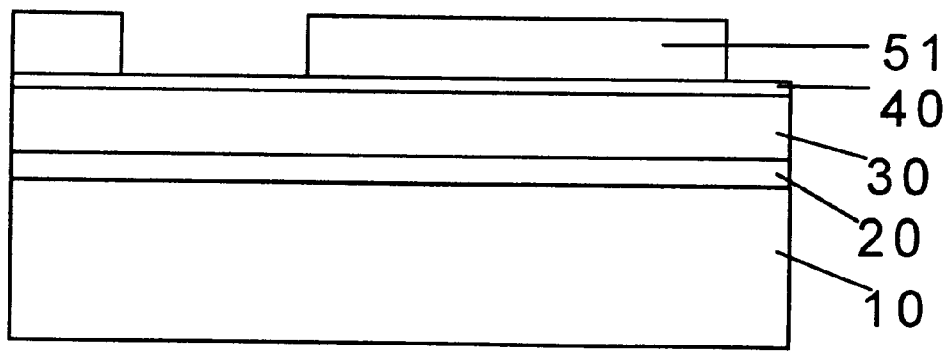
Figure 1F:
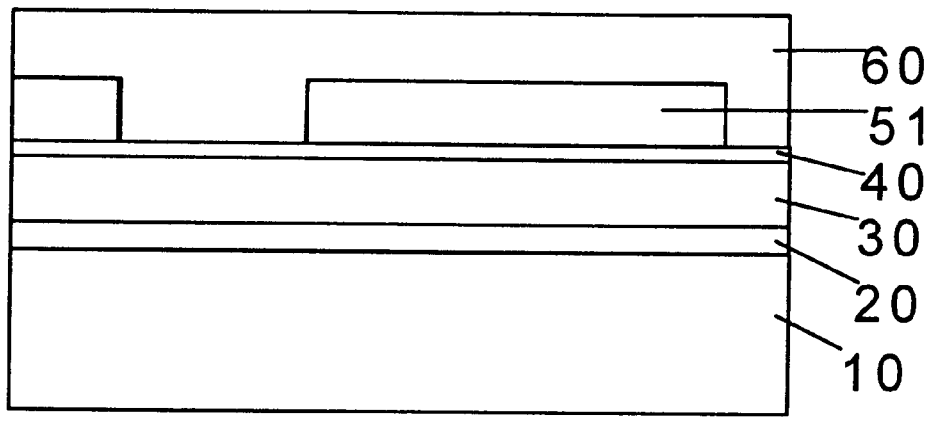
Figure 1G:
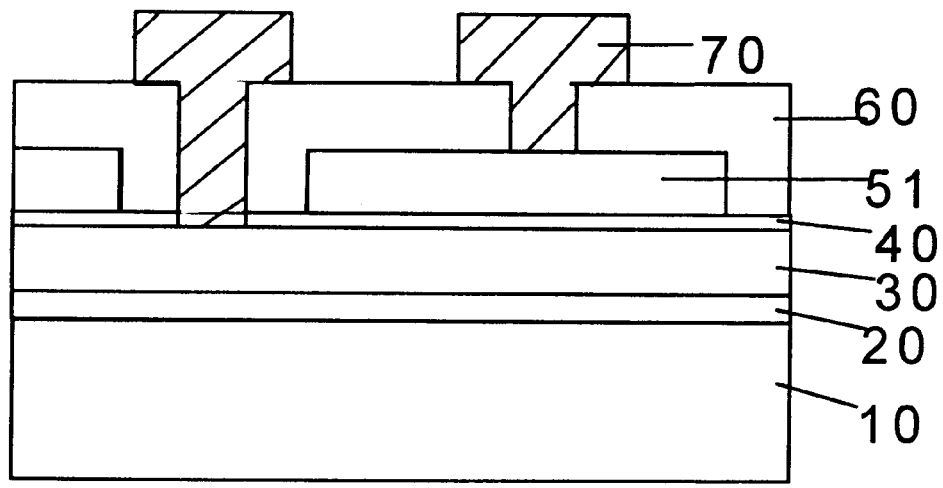

After standard RCA cleaning of a Si-substrate 10, a 100 nm thick isolation silicon dioxide layer 20 was grown thereon at 1000° C., as shown in FIG. 1(a). An $n^+$-polysilicon layer 30 (referred as poly1) having a thickness of 350 nm was deposited on the silicon dioxide layer 20 by low pressure chemical vapor deposition (LPVCD) with in-situ doping of phosphorus impurities, as shown in FIG. 1(b). After another RCA standard cleaning, 7 nm thick anodic polyoxide 40 was grown on the $n^+$-polysilicon layer 30 at a constant electrolyzing voltage of 35 V and at room temperature for 3 minutes in an aqueous solution of 0.01 wt % citric acid by using the electrolytic reaction system shown in FIG. 2. The anodic polyoxide 40 was annealed by RTP at 850° C. in $N_2$ ambient for 30 seconds after the Si-substrate/silicon dioxide/polysilicon/polyoxide (10/20/30/40) semiproduct was removed from the electrolyte solution 81, as shown in FIG. 1(c). Similar to the formation of the $n^+$-polysilicon layer 30, another 350 nm thick $n^+$-polysilicon layer 50 (referred as poly2) was deposited on the polyoxide 40, as shown in FIG. 1(d). The poly2 was then patterned and etched to define a control gate area 51 followed by growing a CVD oxide as a passivation layer 60 on the control gate area 51 and the exposed polyoxide 40, as shown in FIGS. 1(e) and 1(f). Two contact holes were formed in the passivation layer 60 for forming therein two Al electrodes 70 contacting the control gate area 51 and the poly1 respectively by the conventional procedures, as shown in FIG. 1(g).

For comparison another $n^+$-polysilicon/polyoxide/$n^+$-polysilicon capacitor was fabricated by repeating the above procedures except that a 7 nm thick polyoxide film was formed by a conventional RTO process at 850° C. in $O_2$ ambient for 75 seconds to replace the anodic polyoxide film 40.

Figure 3:
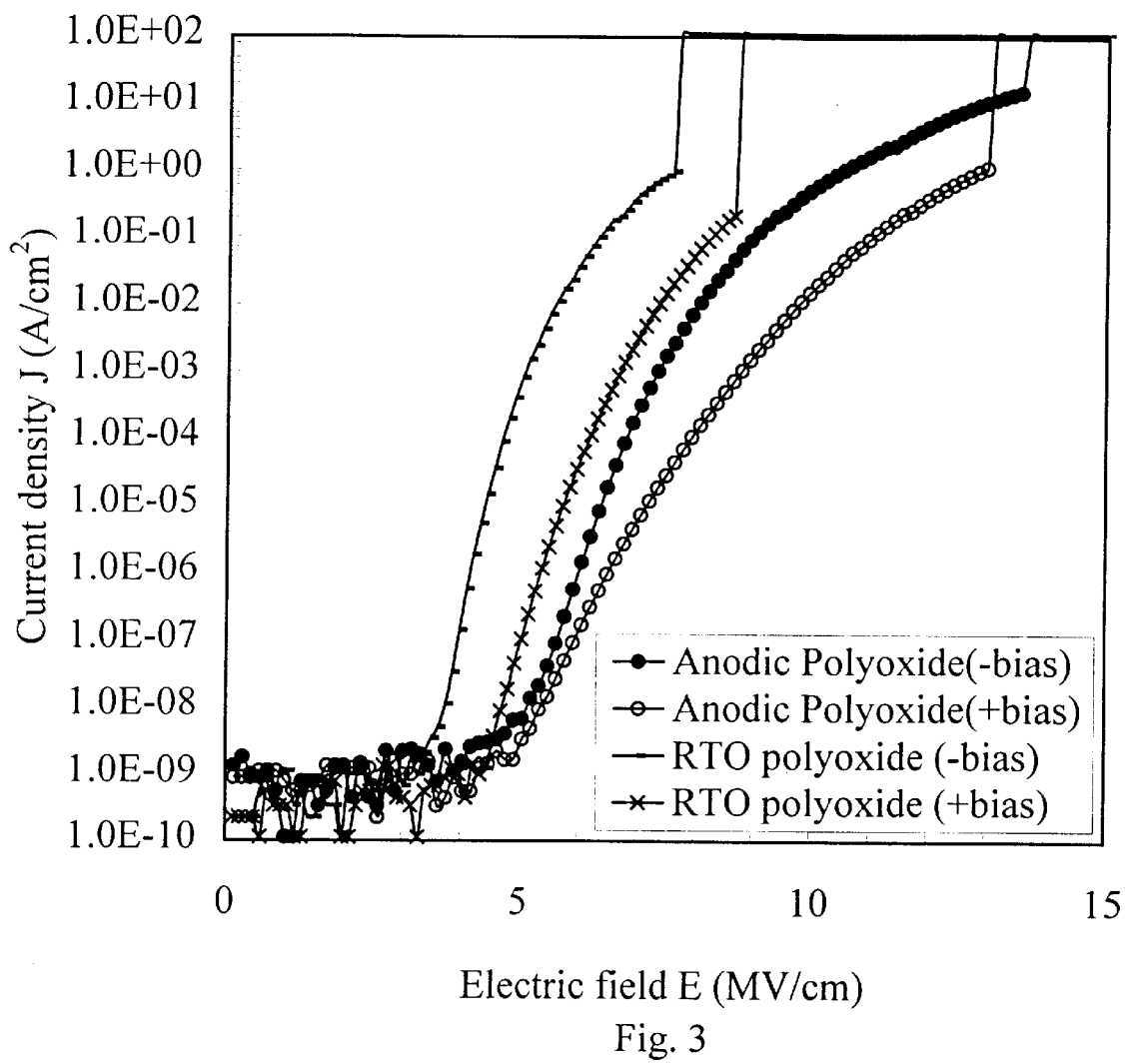
FIG. 3 shows four curves illustrating the J (current density)-E (electric field) characteristics of the $n^+$-polysilicon/polyoxide/$n^+$-polysilicon capacitor made by using the polyoxide layer formed by the anodization method of the present invention as the dielectric layer and the $n^+$-polysilicon/polyoxide/$n^+$-polysilicon capacitor made by using the polyoxide layer formed by the conventional rapid thermal oxidation (RTO) technique as the dielectric layer under positive bias and negative bias.

FIG. 3 shows the J (current density)-E (electric field) characteristics of the $n^+$-polysilicon/polyoxide/$n^+$-polysilicon capacitor made by using the polyoxide film formed by the anodization method of the present invention as the dielectric layer and the $n^+$-polysilicon/polyoxide/$n^+$-polysilicon capacitor made by using the polyoxide layer formed by the conventional rapid thermal oxidation (RTO) technique as the dielectric layer under positive bias (i.e. electrons are injected from the polyoxide/poly1 interface to poly2) and negative bias (i.e. electrons are injected from the poly2/polyoxide interface to poly1). It can be seen from FIG. 3 that anodic polyoxide film has a higher electric breakdown field than the RTO polyoxide film under both bias polarities.

Figure 4:
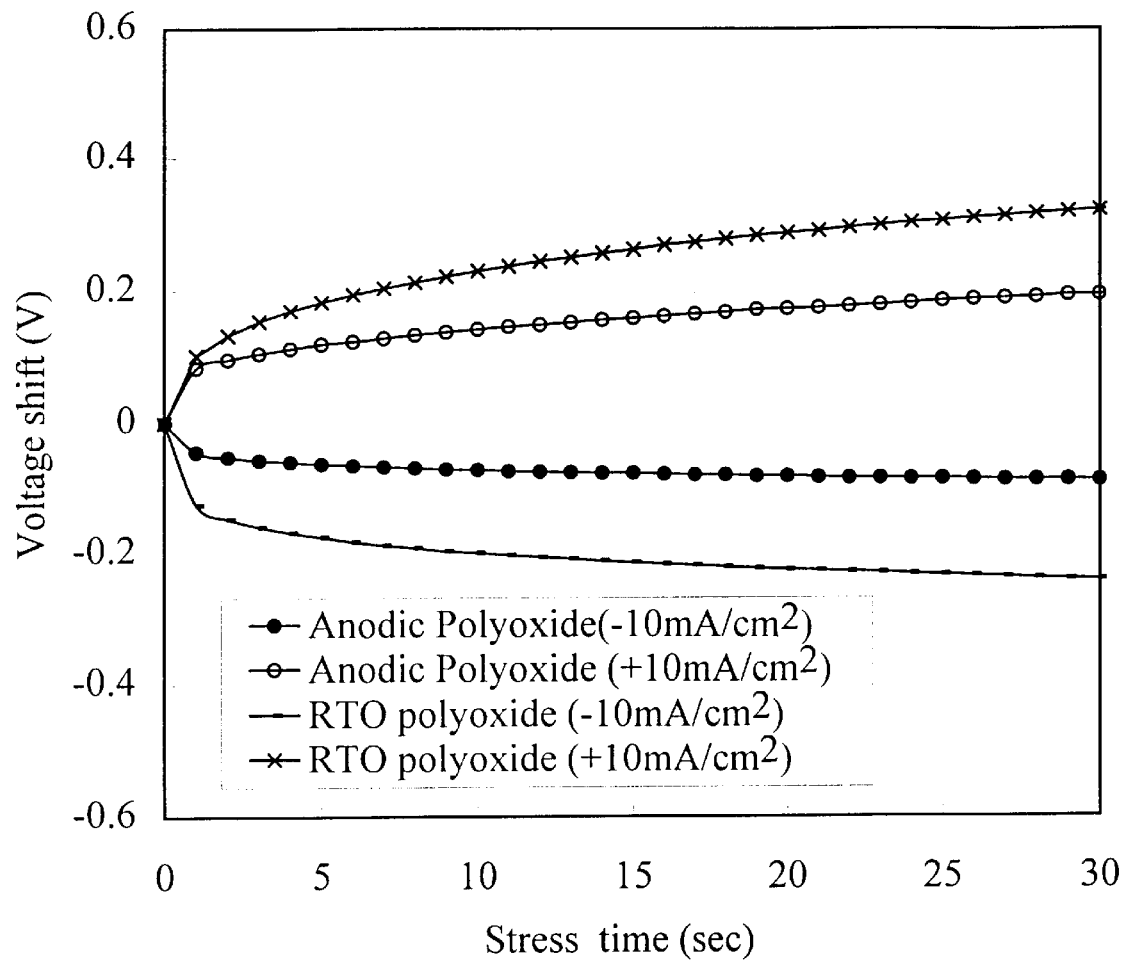
FIG. 4 is a voltage shift versus stress time plot under constant current stress of $+/-0.01$ A/cm$^2$ of the $n^+$-polysilicon/polyoxide/$n^+$-polysilicon capacitor made with the anodic polyoxide of the present invention in comparison with the capacitor made with the conventional RTO polyoxide.

FIG. 4 shows a voltage shift versus stress time plot under constant current stress of +/−0.01 A/cm² of the $n^+$-polysilicon/polyoxide/$n^+$-polysilicon capacitor made with the anodic polyoxide of the present invention in comparison with the capacitor made with the conventional RTO polyoxide. The voltage shift of the anodic polyoxide is much less than that of the RTO polyoxide under both bias polarities, and thus the anodic polyoxide has a better reliability than the RTO polyoxide.

It is apparent from the Example that a nonvolatile memory device having an inter-polysilicon polyoxide film fabricated by the anodic oxidation of the present invention will have better data retention characteristics than those fabricated with a RTO polyoxide.

Having thus described the present invention, which is now deemed appropriate for letters patent is set out in the following appended claims.

What is claimed is:

1. In a fabrication method of a nonvolatile memory device comprising a first doped polysilicon layer as a floating gate, a second doped polysilicon layer as a control gate and an inter-polysilicon polyoxide film therebetween, the improvement which comprises conducting an electrolytic reaction such that said inter-polysilicon polyoxide film is formed on the first doped polysilicon layer acting as an anode.

2. The fabrication method according to claim 1 further comprising subjecting said inter-polysilicon polyoxide film to an annealing treatment.

3. The fabrication method according to claim 2, wherein said annealing treatment comprises heating said inter-polysilicon polyoxide film in an atmosphere of $N_2$, $N_2O$, $O_2$ or a mixture of each other, and at a temperature of 400–1100° C. for a period of time 5–300 seconds by a rapid thermal processing, or 2–60 minutes by furnace.

4. The fabrication method according to claim 1 further comprising subjecting said inter-polysilicon polyoxide film to a plasma passivation treatment.

5. The fabrication method according to claim 1, wherein said electrolytic reaction is conducted at room temperature.

6. The fabrication method according to claim 1, wherein said electrolytic reaction is carried out with a constant or variable current ranging from 0.001–2 A, or with a constant or variable electrolyzing voltage ranging from 1–150 V.

7. The fabrication method according to claim 1, wherein said electrolytic reaction is carried out in an electrolyte solution of pure water or an aqueous solution containing 0.0001–5 wt % of citric acid or ammonia borate.

8. A method to improve the data retention characteristics for a nonvolatile memory device, which comprises forming an anodic polyoxide film between a doped polysilicon floating gate and a doped polysilicon control gate of said nonvolatile memory device, wherein said anodic polyoxide film is formed by conducting an electrolytic reaction such that said inter-polysilicon polyoxide film is formed on the doped polysilicon floating gate acting as an anode, and subjecting said anodic polyoxide film to an annealing treatment or a plasma passivation treatment.

9. The method according to claim 8, wherein said anodic polyoxide film is subjected to said annealing treatment.

10. The method according to claim 9, wherein said annealing treatment comprises heating said anodic polyoxide film in an atmosphere of $N_2$, $N_2O$, $O_2$ or a mixture of each other, and at a temperature of 400–1100° C. for a period of time 5–300 seconds by a rapid thermal processing, or 2–60 minutes by furnace.

11. The method according to claim 8, wherein said anodic polyoxide film is subjected to said plasma passivation treatment.

12. The method according to claim 8, wherein said electrolytic reaction is conducted at room temperature.

13. The method according to claim 8, wherein said electrolytic reaction is carried out with a constant or variable current ranging from 9 0.001–2 A, or with a constant or variable electrolyzing voltage ranging from 1–150 V.

14. The method according to claim 8, wherein said electrolytic reaction is carried out in an electrolyte solution of pure water or an aqueous solution containing 0.0001–5 wt % of citric acid or ammonia borate.

* * * * *